(12) United States Patent
Ino (10) Patent No.: US 7,554,168 B2
(45) Date of Patent: Jun. 30, 2009

(54) SEMICONDUCTOR ACCELERATION SENSOR DEVICE

(75) Inventor: Yoshihiko Ino, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/425,707

(22) Filed: Jun. 22, 2006

(65) Prior Publication Data

US 2007/0045787 A1    Mar. 1, 2007

(30) Foreign Application Priority Data

Jul. 27, 2005    (JP)    ............... 2005-217830

(51) Int. Cl.
*H01L 29/78* (2006.01)
(52) U.S. Cl. ............... 257/417; 257/717; 257/753; 257/759
(58) Field of Classification Search ............... 257/717, 257/753, 759; 73/514
See application file for complete search history.

(56) References Cited

U.S. PATENT DOCUMENTS

| | | | | |
|---|---|---|---|---|
| 5,552,637 A | * | 9/1996 | Yamagata | ............... 257/717 |
| 5,700,581 A | * | 12/1997 | Sachdev et al. | ............... 428/447 |
| 2005/0056096 A1 | * | 3/2005 | Ozawa et al. | ............... 73/514.36 |
| 2006/0094809 A1 | * | 5/2006 | Simone et al. | ............... 524/431 |

FOREIGN PATENT DOCUMENTS

| | | |
|---|---|---|
| JP | 6-160423 A | 6/1994 |
| JP | 9-316166 A | 12/1997 |

* cited by examiner

*Primary Examiner*—Thao X Le
*Assistant Examiner*—Paul E Patton
(74) *Attorney, Agent, or Firm*—Rabin & Berdo, P.C.

(57) ABSTRACT

A semiconductor device comprises a package having a cavity in the interior thereof, a chip having a semiconductor element, and an adhesive portion comprised of a silicone or fluorine resin and particles each having a predetermined shape. The adhesive portion fixes the chip on the bottom of the cavity.

8 Claims, 10 Drawing Sheets

SEMICONDUCTOR ACCELERATION SENSOR DEVICE

BACKGROUND OF THE INVENTION

1. Field of the Invention

The present invention relates to a semiconductor device contained inside a package thereof, a method of manufacturing such semiconductor device, an adhesive material that is used in manufacturing such semiconductor device, and a method of producing this adhesive material. Particularly, the present invention relates to a semiconductor device in which an acceleration sensor for detecting acceleration in three dimensions is contained inside the package, a method of manufacturing such semiconductor device, an adhesive material that is used in manufacturing such semiconductor device, and a method of producing this adhesive material.

2. Background Information

In recent years, acceleration sensors have come to be widely used in various fields of industry, such as automobiles, robots, various precision equipments, etc. Particularly, the demand for semiconductor acceleration sensors using a MEMS (micro electro mechanical system) has dramatically increased, for it is small in size, light, inexpensive, and can be expected to operate accurately and reliably.

There is a type of semiconductor acceleration sensor which detects acceleration by using the piezoresistive effect, i.e., a phenomenon in which a resistance value changes in proportion to a generated stress. This type of semiconductor acceleration sensor usually has a structure in which a semiconductor chip that forms a portion of a sensor (hereinafter such semiconductor chip will be referred to as a sensor chip) is contained inside a package that is comprised of a ceramic material.

A sensor chip using the piezoresistive effect, for instance, has a structure in which a spindle body placed in the center thereof is supported by four flexible beams, each of which has one end fixed to a square fixing portion. These beams each have piezoresistive elements attached thereto, and a Wheatstone bridge circuit can be obtained by connecting these piezoresistive elements to each other via wiring patterns.

In a semiconductor acceleration sensor having such sensor chip, the beams will bend due to the stress generated by the inertial movement of the spindle body when there is a change in speed. At the same time, the piezoresistive elements attached to the beams will also bend. Due to such bending, the resistance value of each piezoresistive element will change, resulting in a change the resistance balance in the Wheatstone bridge. Acceleration can be detected by measuring such change in resistance balance as a current change or a voltage change.

Generally, the sensor chip as described above may be fixed to a cavity inside the package by means of an adhesive material such as an epoxy resin, Pyrex™ glass 7744, kovar, etc., (e.g. patent reference 1 (Laid-Open Japanese Patent Application No. 6-160423) and patent reference 2 (Laid-Open Japanese Patent Application No. 9-316166)).

However, the adhesive material, such as epoxy resin, Pyrex glass 7744, kovar, etc., has a higher elastic modulus than a material such as silicone resin, for instance. Therefore, when such material is used in order to mount the sensor chip on the package, there is a possibility that the impact resistance of the semiconductor acceleration sensor may deteriorate.

One measure for resolving such problem might be to use a resin having a comparatively low elastic modulus, such as silicone resin, fluorine resin, etc., as the adhesive material, instead of using the above described material having a comparatively high elastic modulus.

However, a resin having a comparatively low elastic modulus usually has a large coefficient of thermal expansion (CTE). Therefore, when there is a temperature change, the adhesive portion between the sensor chip and the package may expand/shrink to a considerable extent. This may impart a comparatively large stress to the sensor chip, and may result in a large amount of deformation in the sensor chip. As a result, the electrical characteristics of the piezoresistive elements attached to the sensor chip may change, which will lead to the sensor chip not being able to detect acceleration accurately.

In view of the above, it will be apparent to those skilled in the art from this disclosure that there exists a need for an improved semiconductor device, an improved method of manufacturing a semiconductor device, and improved adhesive material and method of producing an adhesive material used in manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems and to provide a semiconductor device capable of operating stably with respect to heat transmitted to a package thereof, a method of manufacturing such semiconductor device, and an adhesive material and a method of producing an adhesive material used in manufacturing such semiconductor device.

In accordance with a first aspect of the present invention, a semiconductor device comprises a package having a cavity in the interior thereof, a chip comprising a semiconductor element, and an adhesive portion comprised of a solidified resin that includes particles each having a predetermined shape, the adhesive portion fixing the chip to the bottom of the cavity.

In accordance with a second aspect of the present invention, a binding material for fixing a semiconductor chip to a package comprises a silicone resin that comprises particles each having a predetermined shape, and a particle content of approximately 70 to 90% by weight.

In accordance with a third aspect of the present invention, a binding material for fixing a semiconductor chip to a package comprises a fluorine resin that comprises particles each having a predetermined shape, and a particle content of approximately 70 to 90% by weight.

In accordance with a fourth aspect of the present invention, a method of manufacturing a semiconductor device comprises the steps of: preparing a chip having a semiconductor element; preparing a package having a cavity in the interior thereof, and fixing the chip to the bottom of the cavity using a binding material comprising silicone resin and particles each having a predetermined shape.

In accordance with a fifth aspect of the present invention, a method of manufacturing a semiconductor device comprises the steps of: preparing a chip having a semiconductor element; preparing a package having a cavity in the interior thereof, and fixing the chip to the bottom of the cavity using a binding material comprising fluorine resin and particles each having a predetermined shape.

In accordance with a sixth aspect of the present invention, a method of forming a binding material for fixing a semiconductor chip to a package comprises the steps of: preparing a silicone resin; preparing additives each having a predetermined shape; and adding the additives to the silicone resin so that the concentration of the additives in the binding material is approximately 70 to 90% by weight.

In accordance with a seventh aspect of the present invention, a method of forming a binding material for fixing a semiconductor chip to a package comprises the steps of: preparing a fluorine resin; preparing additives each having a predetermined shape; and adding the additives to the fluorine resin so that the concentration of the additives in the binding material is approximately 70 to 90% by weight.

In accordance with an eighth aspect of the present invention, in the semiconductor device according to the first aspect, the solidified resin is a silicone resin or a fluorine resin.

In accordance with a ninth aspect of the present invention, in the semiconductor device according to the first or eighth aspect, the particle content of the adhesive portion is approximately 70 to 90% by weight.

In accordance with a tenth aspect of the present invention, in the semiconductor device according to the first, eighth or ninth aspect, the particles are flake shaped.

In accordance with an eleventh aspect of the present invention, in the semiconductor device according to the first, eighth, or ninth aspect, the particles have an average particle size of about 5±1 μm and an average thickness of about 1±0.1 μm.

In accordance with a twelfth aspect of the present invention, in the semiconductor device according to the first, eighth, or ninth aspect, the particles are spherically shaped.

In accordance with a thirteenth aspect of the present invention, in the semiconductor device according to the first, eighth, or ninth aspect, the particles have an average particle size of about 5 to 20 μm.

In accordance with a fourteenth aspect of the present invention, in the semiconductor device according to the first, eighth, ninth, tenth, eleventh, twelfth, or thirteenth aspect, the particles are comprised of silver, copper, aluminum, nickel, amorphous carbon, graphite, tin oxide, or indium oxide.

In accordance with a fifteenth aspect of the present invention, in the semiconductor device according to the first, eighth, ninth, tenth, eleventh, twelfth, thirteenth, or fourteenth aspect, at least a portion of the package is comprised of a ceramic material.

In accordance with a sixteenth aspect of the present invention, in the semiconductor device according to the first, eighth, ninth, tenth, eleventh, twelfth, thirteenth, fourteenth, or fifteenth aspect, the semiconductor element comprises an acceleration sensor.

In accordance with a seventeenth aspect of the present invention, in the semiconductor device according to the first, eighth, ninth, tenth, eleventh, twelfth, thirteenth, fourteenth, or fifteenth aspect, the semiconductor element includes an acceleration sensor comprising a fixing portion, a spindle body, and one or more beams, the fixing portion being directly or indirectly fixed to the bottom of the cavity, the beams suspending the spindle body from the fixing portion, and the spindle body displaceable with respect to the fixing portion.

In accordance with an eighteenth aspect of the present invention, in the semiconductor device according to the second or third aspect, the particles have an average particle size of about 5±1 μm and an average thickness of about 1±0.1 μm.

In accordance with a nineteenth aspect of the present invention, in the semiconductor device according to the second, third, or eighteenth aspect, the predetermined particles are comprised of silver, copper, aluminum, nickel, amorphous carbon, graphite, tin oxide, or indium oxide.

In accordance with a twentieth aspect of the present invention, in the method of manufacturing a semiconductor device according to the fourth or fifth aspect, the particle content of the binding material is approximately 70 to 90% by weight.

In accordance with a twenty first aspect of the present invention, in the method of manufacturing a semiconductor device according to the fourth, fifth, or twentieth aspect, the particles are flake shaped.

In accordance with a twenty second aspect of the present invention, in the method of manufacturing a semiconductor device according to the fourth, fifth, or twentieth aspect, the particles are spherically shaped.

In accordance with a twenty third aspect of the present invention, in the method of manufacturing a semiconductor device according to the fourth, fifth, twentieth, twenty first, or twenty second aspect, the particles are comprised of silver, copper, aluminum, nickel, amorphous carbon, graphite, tin oxide, or indium oxide.

In accordance with a twenty fourth aspect of the present invention, in the method of manufacturing a semiconductor device according to the fourth, fifth, twentieth, twenty first, twenty second, or twenty third aspect, the semiconductor element comprises an acceleration sensor.

In accordance with a twenty fifth aspect of the present invention, in the method of forming a binding material according to the sixth or seventh aspect, the additives have an average particle size of about 5±1 μm and an average thickness of about 1±0.1 μm.

In accordance with a twenty sixth aspect of the present invention, in the method of forming a binding material according to the sixth, seventh, or twenty fifth aspect, the additives are comprised of silver, copper, aluminum, nickel, amorphous carbon, graphite, tin oxide, or indium oxide.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 6A to FIG. 8B are diagrams showing processes of manufacturing the semiconductor acceleration sensor device according to the first embodiment of the present invention;

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings. The structure shown in each drawing is depicted with a certain shape, size and position so as to show the outline of the present invention. Therefore, the present invention is not limited to the specific shape, size, and position depicted in the drawings. In addition, in each drawing, in order to clearly show the structure, a portion of the hatching in a cross-sectional surface is omitted. Moreover, numerical values indicated in the following description are only given as examples, and therefore, they are not for the purpose of limiting the present invention. These conditions apply equally to all the embodiments of the present invention.

Structure of Semiconductor Acceleration Sensor Chip 10

Now, a structure of a semiconductor acceleration sensor chip 10 according to the first embodiment of the present invention will be described in detail with reference to the drawings. This embodiment will show the application of a three dimensional acceleration sensor using the piezoresistive effect, i.e., a phenomenon in which a resistance value changes in proportion to a generated stress.

Figure 1:
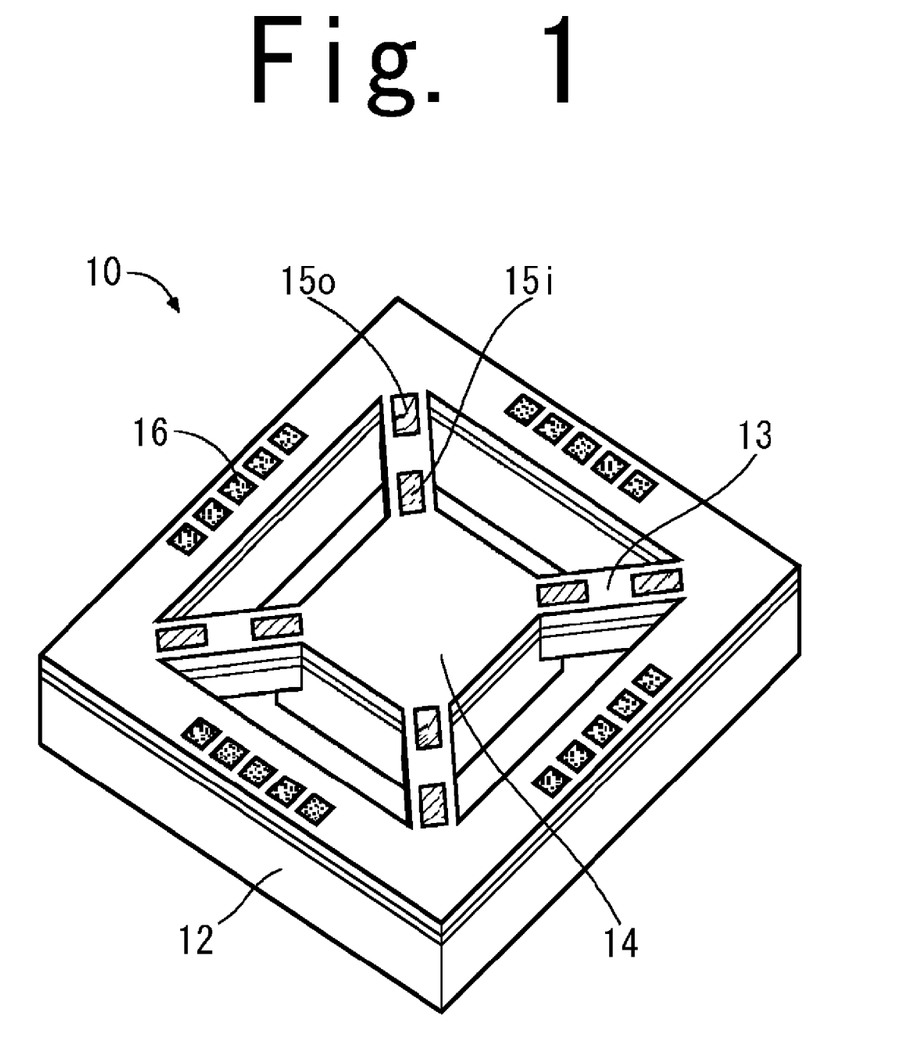
FIG. 1 is a perspective view showing an outline structure of a semiconductor acceleration sensor chip according to the present invention.

FIG. 1 is a perspective view showing an outline structure of the semiconductor acceleration sensor chip 10, which is the three dimensional acceleration sensor applied in this embodiment. As shown in FIG. 1, the semiconductor acceleration sensor chip 10 has a fixing portion 12, beams 13, a spindle body 14, piezoresistive elements 15$i$ and 15$o$, and electrode pads 16. The fixing portion 12, the beams 13, and the spindle body 14 are integrated into a single body by processing a predetermined semiconductor substrate.

The predetermined semiconductor substrate into which the fixing portion 12, the beams 13, and the spindle body 14 are formed may be a silicon substrate, for instance.

The fixing portion 12 is arranged in a square shape by combining four column-shaped members, for instance, and has a square opening in the center thereof. The fixing portion 12 in the present invention, however, is not limited to this shape, and it is also possible to have a circular shape. In the following, for the convenience of explanation, the surface of the square shaped member on which the electrode pads 16 are formed and the surface of the beams 13 on which the piezoresistive elements 15$i$ and 15$o$ are formed will be collectively referred to as the upper side of the semiconductor acceleration sensor chip 10.

The length of each side of the outer circumference of the fixing portion 12 is about 1.6 mm (millimeters), for instance. On the other hand, the length of each side of the inner circumference of the fixing portion 12 (i.e., the square opening) is about 1.2 mm, for instance. In this case, each column-shaped member that forms the fixing portion 12 will be about 0.2 mm in width on the upper surface thereof. Here, the fixing portion 12 may be about 0.3 mm thick, for instance.

The beams 13 are disposed at each corner of the inner circumference of the fixing portion 12 and extend toward the center thereof. Therefore, in the semiconductor acceleration sensor chip 10 of this embodiment, there are four beams 13. However, the present invention is not limited to this structure, and it is also possible to have a structure in which each beam 13 is disposed at the approximate midpoint of each column-shaped member forming the fixing portion 12 and extend toward the center of the fixing portion 12.

The beams 13 are formed so that they will bend due to stress generated by the inertial movement of the spindle body 14 when the semiconductor acceleration sensor chip 10 is accelerated. That is, the beams 13 are configured to be flexible. In this embodiment, each beam 13 is made to be about 0.1 mm wide on the upper surface and about 0.1 mm thick, for instance, in order to have flexibility. Furthermore, each beam is formed such that the upper surface thereof is level with the upper surface of the fixing portion 12, and the lower surface thereof is at a higher position than the lower surface of the fixing portion 12. Thus, for instance, if the lower surface of the fixing portion 12 is to fixed to a bottom surface 21$a$ of a cavity 21$c$, which will be described in more detail below, deformation of the beams 13 will not be inhibited by the bottom surface 21$a$ of the cavity 21$c$.

The spindle body 14 is disposed at the approximate center of the opening of the square fixing portion 12, and at the ends of the four beams 13. In other words, the spindle body 14 is supported by the beams 13 such that the spindle body 14 will be positioned at the approximate center of the opening of the fixing portion 12.

The spindle body 14 functions as a weight for making the beams 13 bend in accordance with the acceleration applied to the semiconductor acceleration sensor chip 10. In this embodiment, the upper surface of the spindle body 14 is a square that is about 0.6 mm on one side, for instance, and the thickness of the spindle body 14 is about 0.2 mm, for instance. In addition, the spindle body 14 is formed such that the upper surface thereof will be at the same level as the upper surfaces of the fixing portion 12 and the beams 13, and the lower surface thereof will be at a higher position than the lower surface of the fixing portion 12. Thus, for instance, if the lower surface of the fixing portion 12 is to be fixed to a bottom surface 21$a$ of a cavity 21$c$, which will be described in more detail below, displacement of the spindle body 14 with respect to the fixing portion 12 will not be inhibited by the bottom surface 21$a$ of the cavity 21$c$.

On the upper surface of each beam 13, the piezoresistive element 15$o$ is attached to the base of the beam with respect to the fixing portion 12, and the piezoresistive element 15$i$ is attached to the base of the beam with respect to the spindle body 14. These piezoresistive elements 15$o$ and 15$i$ are electrically connected with the electrode pads 16 formed on the upper surface of the fixing portion 12 through wiring patterns (not shown in the figure), thus forming a Wheatstone bridge circuit. Accordingly, by detecting the resistance balance of the piezoresistive elements 15$i$ and 15$o$ through the electrode pads 16 and the wiring patterns (not shown in the figure), it is possible to detect the amount of bending with respect to the beam 13, and based on the amount of bending with respect to the beam 13, it is possible to specify the magnitude and direction of acceleration applied to the semiconductor acceleration sensor chip 10.

Here, it is possible to bond a glass substrate, etc., on the back side of the semiconductor acceleration sensor chip 10 according to need. In such case, an anode bonding method, for instance, can be applied in bonding the semiconductor acceleration sensor chip 10 and the glass substrate.

Structure of Semiconductor Acceleration Sensor Device 1

Now, the structure of a semiconductor acceleration sensor device 1 according to the first embodiment of the present invention will be described in detail with reference to the drawings. The semiconductor acceleration sensor device 1 is formed by packaging the above-described semiconductor acceleration sensor chip 10.

Figure 2:
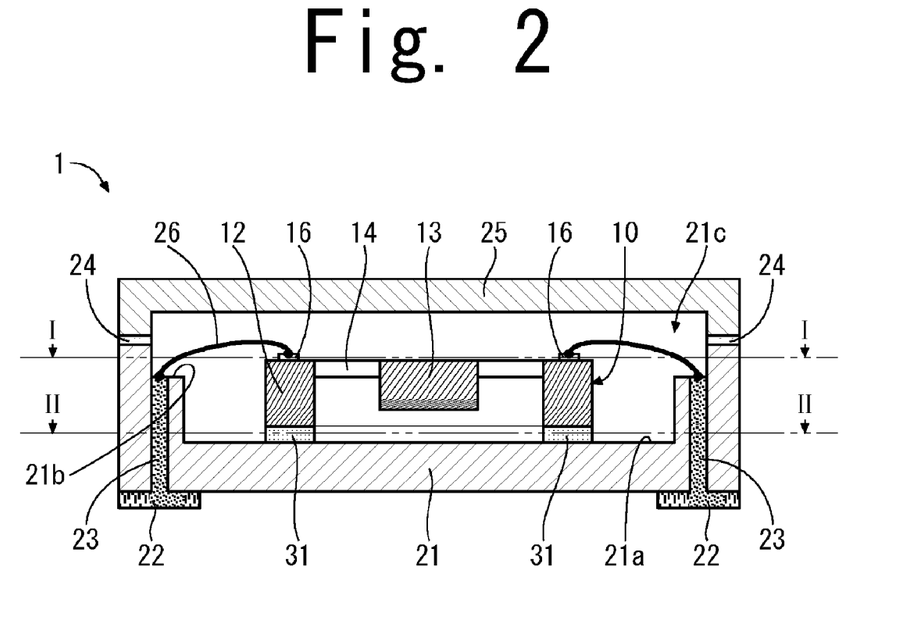
FIG. 2 is a sectional view of a semiconductor acceleration sensor device according to a first embodiment of the present invention.
Figure 3:
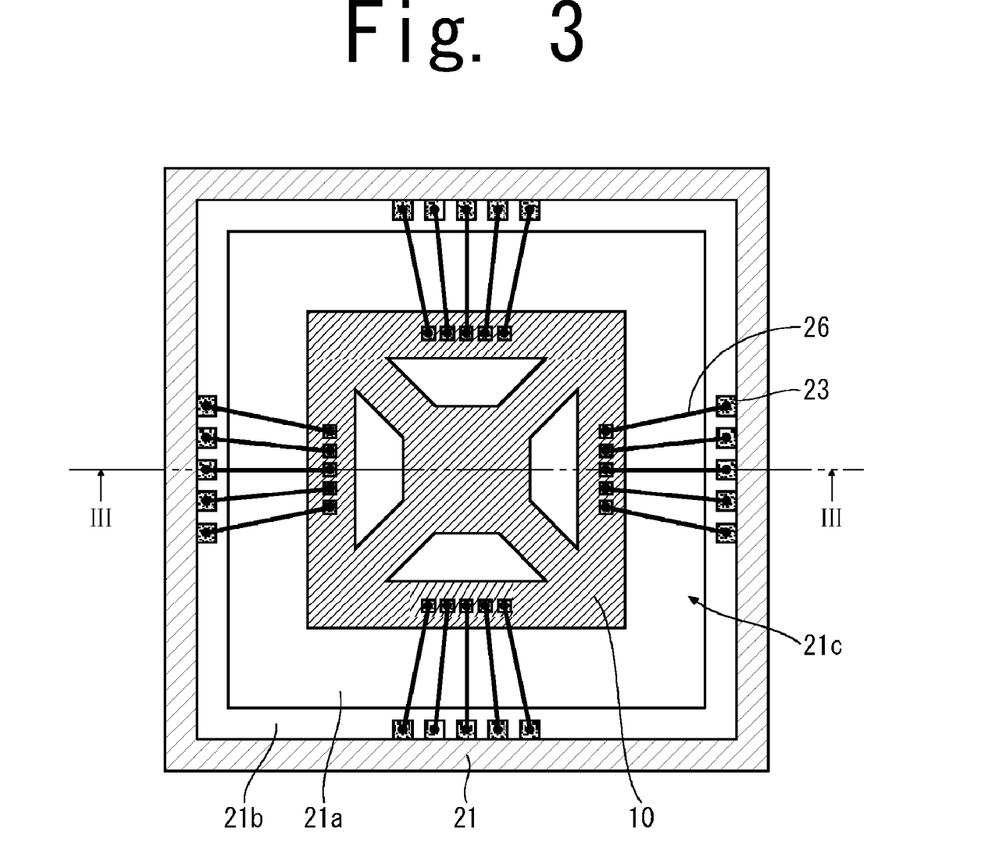
FIG. 3 is a sectional view of the semiconductor acceleration sensor device according to the first embodiment of the present invention taken along line I-I' shown in FIG. 2.
Figure 4:
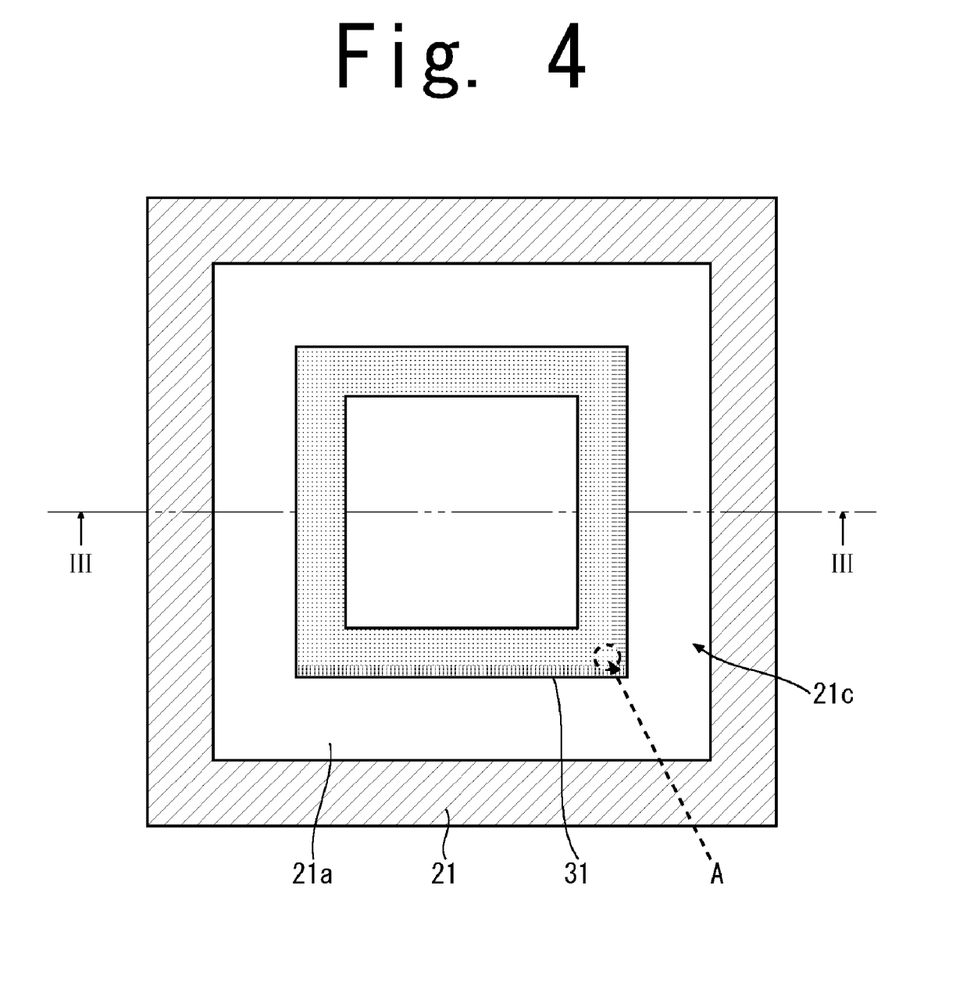
FIG. 4 is a sectional view of the semiconductor acceleration sensor device according to the first embodiment of the present invention taken along line II-II' shown in FIG. 2.

FIG. 2 is a sectional view of the semiconductor acceleration sensor device 1. FIG. 3 is a sectional view of the semiconductor acceleration sensor device 1 taken along line I-I' shown in FIG. 2, and FIG. 4 is a sectional view of the semiconductor acceleration sensor device 1 taken along line II-II' shown in FIG. 2. Here, the section shown in FIG. 2 corresponds to a section of the semiconductor acceleration sensor device 1 taken along line III-III' shown in FIG. 4.

As shown in FIG. 2 to FIG. 4, the semiconductor acceleration sensor device 1 includes the semiconductor acceleration sensor chip 10, a lower container 21, and an upper lid 25. Here, the lower container 21 and the upper lid 25 form a package for housing the semiconductor acceleration sensor chip 10. In the following, for the convenience of explanation, the side where the upper lid 25 is positioned will be referred to as the upper side.

In this structure, the semiconductor acceleration sensor chip 10 is fixed to the approximate center of the bottom surface 21a of the cavity 21c in the lower container 21 by using an adhesive material. The adhesive material to be used here will be described in more detail below. In the drawings and the following description, the solidified adhesive material will be referred to as an adhesive portion 31.

As shown in FIG. 2 and FIG. 4, the adhesive portion 31 is formed on the lower surface of the fixing portion 12 of the semiconductor acceleration sensor chip 10. That is, the adhesive material that comprises the adhesive portion 31 is applied only to the lower surface of the fixing portion 12 of the semiconductor acceleration sensor chip 10, and the semiconductor acceleration sensor chip 10 is fixed to the bottom surface 21a of the cavity 21c only at this region.

The lower container 21 that is a portion of the package for housing the semiconductor acceleration sensor chip 10 is a ceramic package having a laminated structure, for instance. As shown in FIG. 2, the lower container 21 includes the cavity 21c for housing the semiconductor acceleration sensor chip 10.

As shown in FIG. 2 and FIG. 3, sidewalls of the lower container 21 have step surfaces 21b, which are positioned so as to be lower than the upper surface of the cavity 21c (i.e., the surface of the cavity 21c on which the upper lid 25 is attached). Portions of a wiring pattern 23 that is formed inside the lower container 21 are exposed on each step surface 21b. The exposed portions of the wiring pattern 23 are electrically connected to the electrode pads 16 in the semiconductor acceleration sensor chip 10 through metal wires 26.

As shown in FIG. 2, the wiring pattern 23 formed inside the lower container 21 is electrically connected with metal pads (hereinafter referred to as foot patterns 22) which are formed on the lower surface of the lower container 21. These foot patterns 22 function as electrode patterns that electrically connect to electrode pads in a circuit substrate (not shown in the figure).

As shown in FIG. 2 and FIG. 3, the electrode pads 16 in the semiconductor acceleration sensor chip 10 that are contained inside the cavity 21c of the lower container 21 are electrically connected with the exposed portions of the wiring patterns 23 on the step surfaces 21b of the lower container 21 through the metal wires 26. These metal wires 26 can be formed with metal, such as gold, aluminum, etc.

As described above, the opening of the lower container 21 where the semiconductor acceleration sensor chip 10 is contained is sealed by the upper lid 25, as shown in FIG. 2. The upper lid 25 is fixed to the upper surface of the lower container 21 by means of a thermosetting resin 24, such as an epoxy resin, so as to seal the opening of the lower container 21. A 42 metal alloy, stainless steel, etc., for instance, can be used as the material that forms the upper lid 25. In addition, the interior of the sealed package (21, 25) is purged by nitrogen gas or dry air, etc., for instance.

Figure 5:
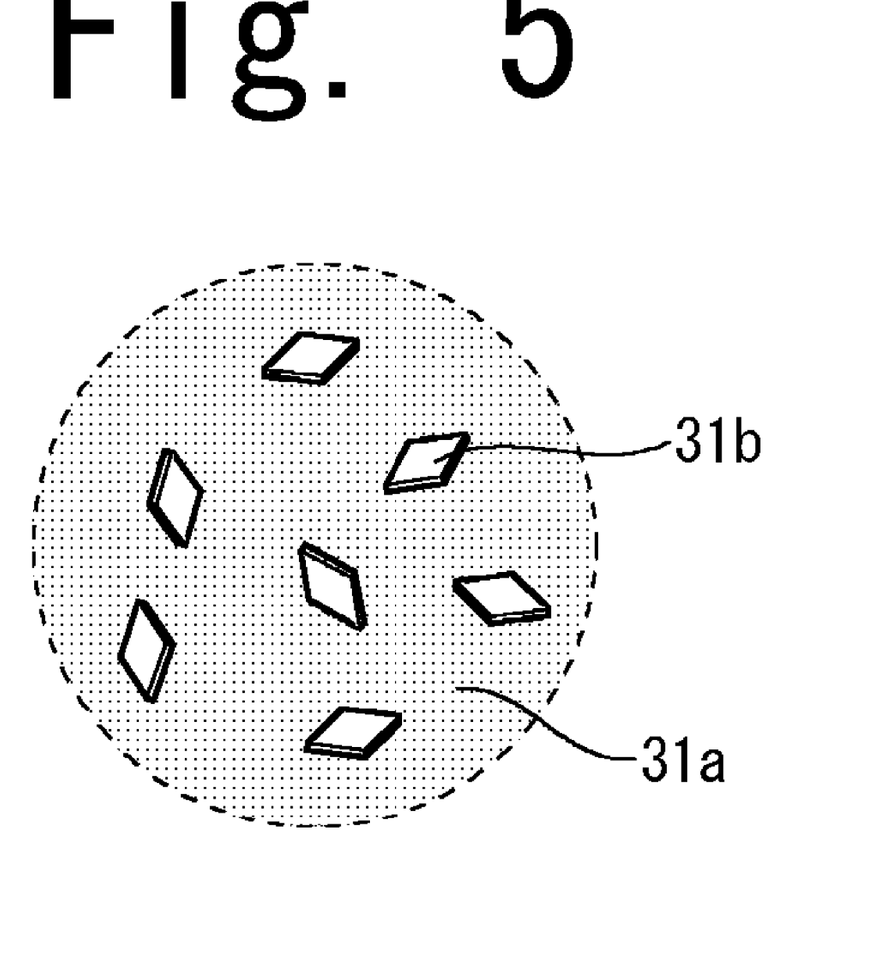
FIG. 5 is a close-up of region A shown in FIG. 4.

In the above structure, the adhesive material for fixing the semiconductor acceleration sensor chip 10 to the bottom surface 21a of the cavity 21c is a resin having a comparatively low elastic modulus and having flakes of metal added thereto. FIG. 5 is a close-up of a region A shown in FIG. 4. The structure of the adhesive portion 31 according to this embodiment will be described with reference to FIG. 5.

As shown in FIG. 5, the adhesive portion 31 in this embodiment is formed by solidifying an adhesive material comprised of a resin 31a that is the main component thereof, and flakes 31b that have been added to the resin 31a.

The resin 31a may be a poly-organosiloxane having a siloxane bond (Si—O) skeleton, such as silicone resin, etc. It is also possible to use fluorine resin, etc., for instance.

With respect to the flakes 31b, it is possible to use metal flakes having an average particle diameter of about 5±1 μm (micrometers), and an average thickness of about 1 μm±10%. Although FIG. 5 shows metal flakes having a square planar shape, the present invention is not limited thereto, and it is also possible to use metal flakes whose planar shape is a polygon, such as a triangle, a pentagon, etc., for instance. In this embodiment, the resin 31a can include metal flakes with different shapes.

For instance, the material of the flake 31b may be a metal, such as silver (Ag), copper (Cu), aluminum (Al), nickel (Ni), etc. or a nonmetal, such as amorphous carbon, graphite, tin oxide, indium oxide, etc.

Here, the flakes 31b are added to the resin 31a such that their weight percentage in the resin 31a will be about 70 to 90%, for example. Using such resin 31a, it is possible to reduce the CTE of the adhesive portion 31 and increase the heat conductivity of the adhesive portion 31.

For instance, in an experiment conducted using silicone resin as the resin 31a to which silver flakes 31b are added at about 80 weight %, it was possible to reduce the CTE of the adhesive portion 31, which is the adhesive material being solidified, from about 300 ppm (parts per million) [/° C.] (when containing no flakes) to about 150 ppm [/° C.]. Likewise, in this experiment, it was possible to improve the heat conductivity of the adhesive portion 31 from 0.16 [W/(m·k)] (when containing no flakes) to 0.18 [W/(m·k)].

As a result, compared to a situation in which a silicone resin containing no flakes 31b is used for the adhesive portion 31, it was confirmed that the silicone resin with silver flakes 31b can be used to reduce the amount of change in an offset value of the resistance value of the piezoresistive elements 15i and 15o in the semiconductor acceleration sensor device 1 with respect to a temperature change by about 50%. That is, by using the silicone resin with silver flakes 31b, it was possible to stabilize the offset value with respect to temperature change. In addition, compared to a situation in which a silicone resin containing no flakes 31b is used for the adhesive portion 31, it was confirmed that the use of the silicone resin containing silver flakes 31b can reduce overshoot in the offset value of the resistance value of the piezoresistive elements 15i and 15o in the semiconductor acceleration sensor device 1 from 5~20% to approximately 0%. Moreover, under these conditions, it was possible to secure an impact resistance of more than 11000 G (gravity acceleration) for the adhesive portion 31.

By reducing the CTE of the adhesive material (i.e., the adhesive portion 31) in the manner described above, it will be possible to reduce the amount of change in the adhesive portion 31 with respect to temperature changes, and therefore, it will also be possible to have less deformation in the semiconductor acceleration sensor chip 10 caused by deformation of the adhesive portion 31. Furthermore, by increasing the heat conductivity of the adhesive material (i.e., the adhesive portion 31) in the manner described above, it will be possible to improve the heat transfer efficiency between the package and the semiconductor acceleration sensor chip 10. As a result, it will be possible to improve the capability of the semiconductor acceleration sensor chip 10 to respond to external temperature changes.

Method of Manufacturing Semiconductor Acceleration Sensor Device 1

Now, a method of manufacturing the semiconductor acceleration sensor device 1 according to the first embodiment of the present invention will be described in detail with reference to the drawings.

Figure 6A:
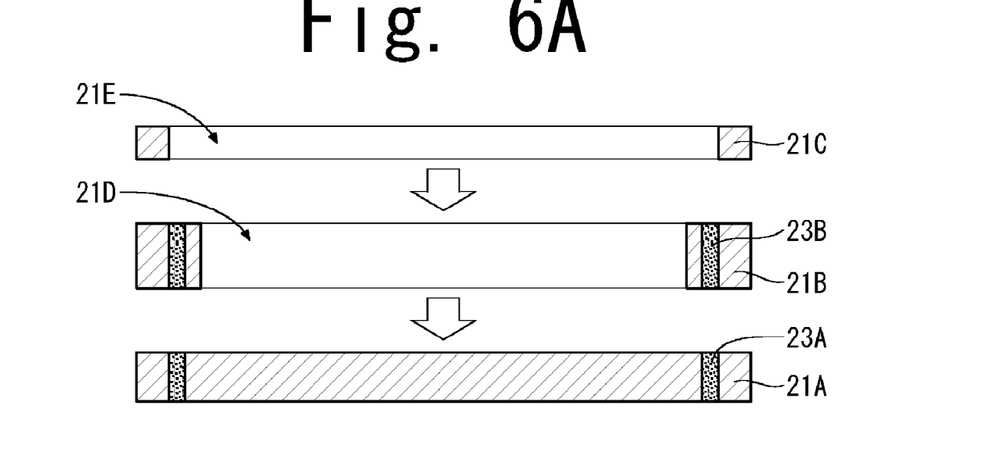

In this manufacturing method, first, green sheets 21A, 21B and 21C are prepared as components for constructing the lower container 21, as shown in FIG. 6A. In the lower container 21, the green sheet 21C is a component for forming the sidewalls of the cavity 21c above the step surfaces 21b, and the green sheet 21B is a component for forming the sidewalls of the cavity 21c below the step surfaces 21b. The green sheet 21A is a component forming the bottom plate of the lower container 21. Here, each of the green sheets 21C, 21B, and 21A may have a multi-layer structure including multiple green sheets.

The green sheet 21C has a cavity 21E that is opened by a puncher. The green sheet 21B has a cavity 21D and via holes for forming portions (i.e., the upper portions) of the wiring patterns 23 that are opened by a puncher. The green sheet 21A has via holes for forming portions (i.e., the lower parts) of the wiring patterns 23 that are opened by a puncher. Here, the cavity 21E formed in the green sheet 21C is slightly larger than the cavity 21D formed in the green sheet 21B. By this arrangement, the step surfaces 21b will be formed when the green sheet 21B is laminated on the green sheet 21C.

Here, the via holes of the green sheet 21B are arranged to overlap the via holes of the green sheet 21A when the green sheet 21B is placed over the green sheet 21A. These via holes are filled with conductive patterns 23B and 23A, which will eventually turn into wiring patterns 23, by a screen printing method, for instance.

Figure 6B:
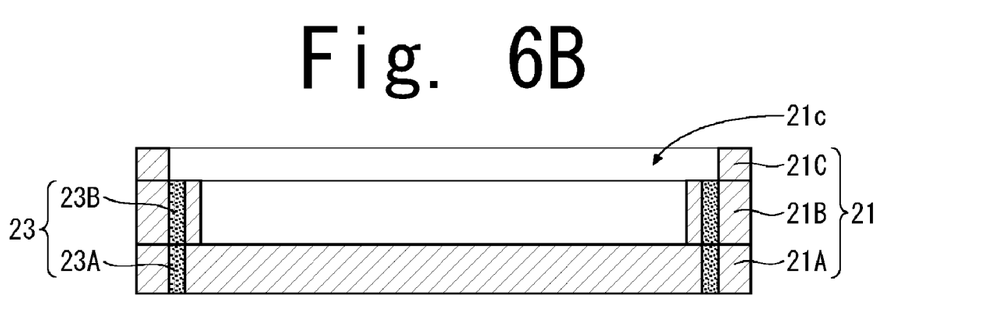

Next, as shown in FIG. 6B, the green sheets 21C, 21B, and 21A are laminated sequentially, pressed together in the vertical direction, and then have a calcination process conducted thereon, in order to form the lower container 21 including the cavity 21c and the wiring patterns 23. This calcination process may be conducted under normal pressure at a temperature of 1500° C. for 24 hours.

Figure 6C:
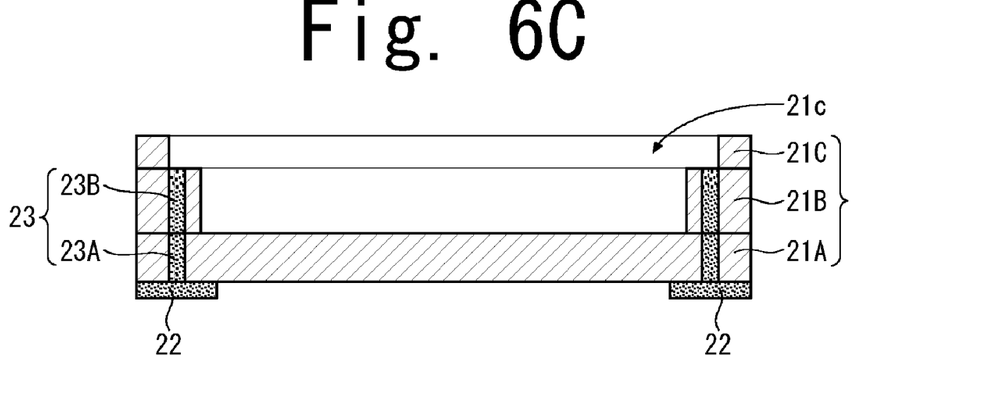

After that, as shown in FIG. 6C, the foot patterns 22 which are to be electrically connected with the wiring patterns 23 are formed on the lower surface of the lower container 21 by means of a screen printing method, for instance. Here, it is possible to form the foot patterns 22 prior to bonding the green sheets 21C, 21B, and 21A.

Figure 7A:
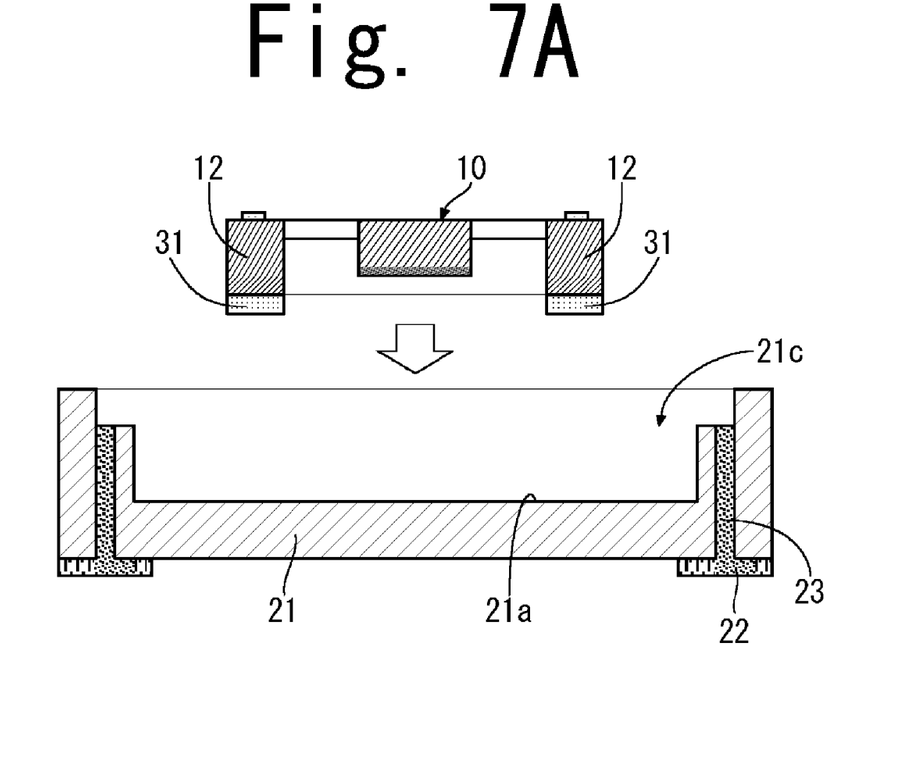
Figure 7B:
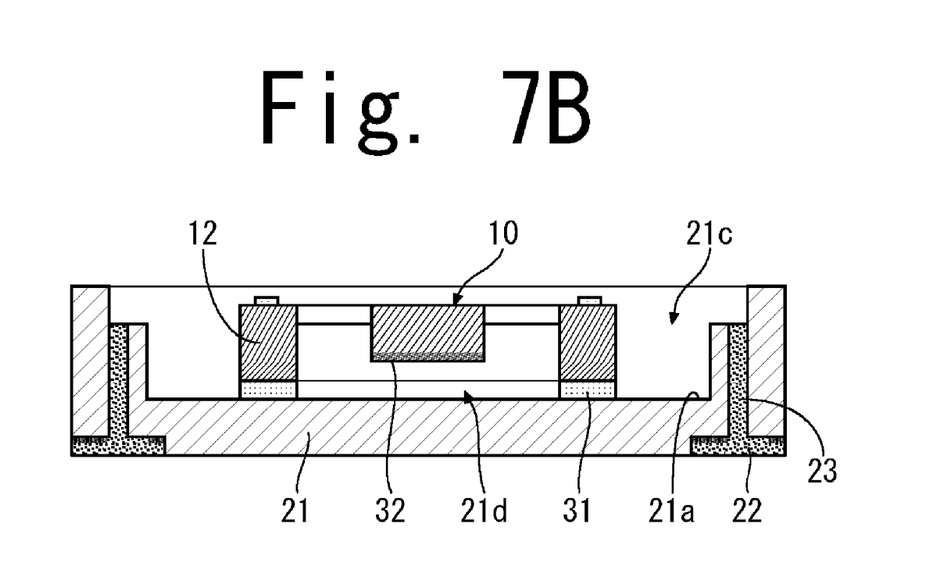

After the lower container 21 including the wiring patterns 23 and the foot patterns 22 is prepared in the manner described above, the adhesive material 31A is applied to the lower surface of the fixing portion 12 in the semiconductor acceleration sensor chip 10, as shown in FIG. 7A. As mentioned earlier, the adhesive material 31A in this embodiment is comprised of the resin 31a, such as silicone resin, to which the flakes 31b are added. Then, the semiconductor acceleration sensor chip 10 having the adhesive material 31A applied thereto is placed at a predetermined position on the bottom surface of the cavity 21c in the lower container 21, and this combination will be heat-treated while being pressed together in the vertical direction. Thus, the adhesive material 31A will be solidified to form the adhesive portion 31, as shown in FIG. 7B, and the semiconductor acceleration sensor chip 10 will be fixed to the bottom surface 21a of the cavity 21c through this adhesive portion 31. Here, the heat treatment may be conducted under normal pressure at a temperature of 180° C. for one hour.

Figure 8A:
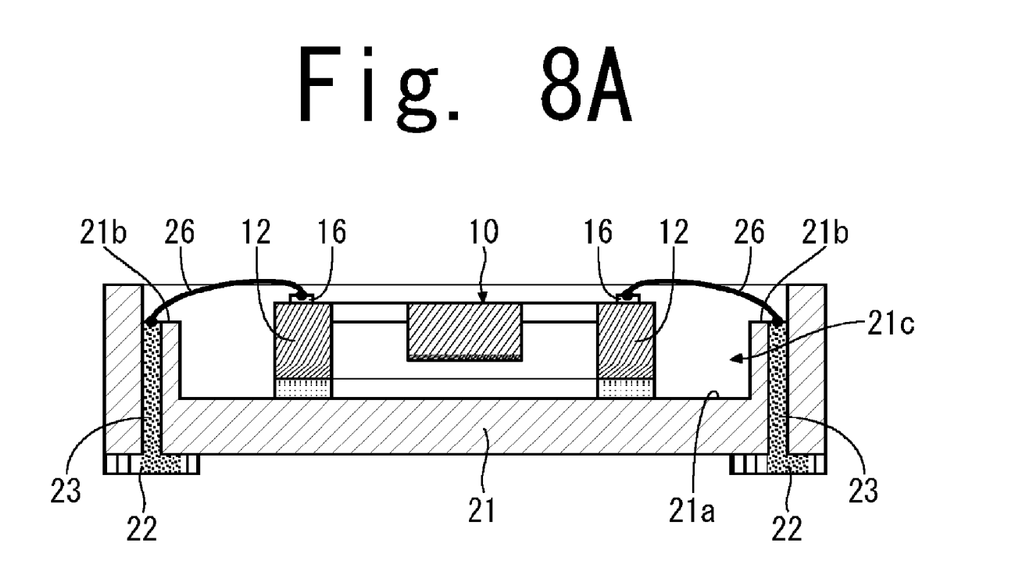

Next, as shown in FIG. 8A, by bonding metal wires 26 comprised of gold, the electrode pads 16 in the semiconductor acceleration sensor chip 10 and the exposed portions of the wiring patterns 23 on the lower container 21 will be electrically connected. Here, the bonding process may be conducted using an ultrasonic combined thermocompression method under 30 gf (/cm$^2$) of pressure at a temperature of 230° C. The electrode pads 16, to which one end of each of the metal wires 26 are bonded, are formed on the fixing portion 12 on the semiconductor acceleration sensor chip 10, and therefore, the beams 13, etc., in the semiconductor acceleration sensor chip 10 will not be damaged when bonding the metal wires 26.

Figure 8B:
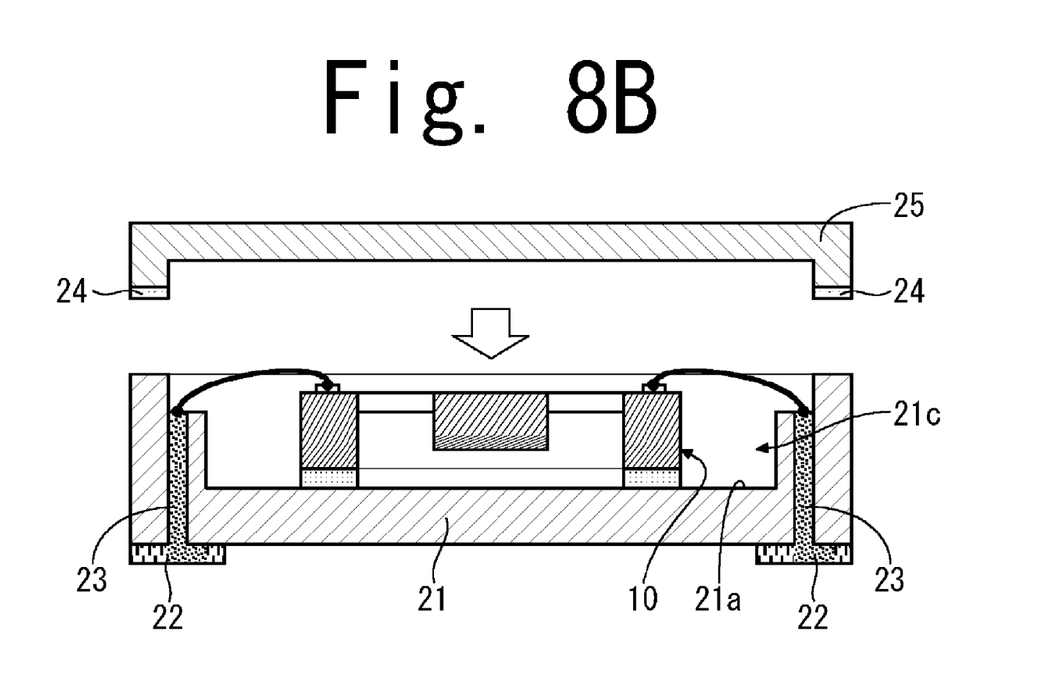

Next, as shown in FIG. 8B, the upper lid 25 comprised of 42 alloy metal or stainless steel, etc. is prepared, and the thermosetting resin 24 such as epoxy resin, etc., is applied to the lower surface of the upper lid 25. Then the upper lid 25 is placed over the lower container 21, and this combination will be heat-treated while being pressed together in the vertical direction. Thus, the upper lid 25 will be fixed to the lower container 21. Here, the heat treatment may be conducted under 5 kg (/cm$^2$) of pressure at a temperature of 150° C. for two hours. In this way, the semiconductor acceleration sensor device 1 illustrated in FIG. 2 to FIG. 4 can be manufactured. Note that in sealing the lower container 21 with the upper lid 25, the cavity 21c is to be purged by nitrogen gas or dry air, etc., for instance.

Method of Producing Adhesive Material 31A

As noted above, the adhesive material 31A in this embodiment is comprised of the resin 31a, which is a poly-organosiloxane having a siloxane bond (Si—O) skeleton, such as a silicone resin, etc., and the flakes 31b are added to the resin 31a at about 70 to 90 weight %, for instance. Here, the average particle diameter of the flakes 31b is about 5±1 μm (micrometers) and the average thickness is about 1 μm, for instance. Under such conditions, the resin 31a and the flakes 31b are mixed together well in order to produce the adhesive material 31A. As described above, the semiconductor acceleration sensor device 1, which is a semiconductor device according to the first embodiment of the present invention, has a cavity 21c in the interior thereof, and comprises a package having a lower container 21 and an upper lid 25, a semiconductor acceleration sensor chip 10, and an adhesive portion 31 that is formed from a resin 31a such as silicone resin or fluorine resin, etc. having metal/nonmetal flakes 31b added thereto, the adhesive portion 31 serving to fix the semiconductor acceleration sensor chip 10 to the inside of the cavity 21c.

The resin 31a such as silicone resin or fluorine resin, etc. has a comparatively low elastic modulus as compared to a resin such as epoxy resin, etc. By fixing the semiconductor acceleration sensor chip 10 to the package (21, 25) using such resin 31a, the semiconductor acceleration sensor device 1 can have improved impact resistance. By using the resin 31a to which flakes 31b comprised of a material such as silver, copper, aluminum, nickel, amorphous carbon, graphite, tin oxide or indium oxide, etc. are added at 70 to 90 weight %, for instance, it will be possible to reduce the CTE of the adhesive portion 31, and increase the heat conductivity of the adhesive portion 31 at the same time. By reducing the CTE of the adhesive material (i.e., the adhesive portion 31) in this way, it will be possible to reduce the amount of deformation in the adhesive portion 31 with respect to temperature changes, and therefore, it will also be possible to have less deformation in the semiconductor acceleration sensor chip 10 caused by deformation of the adhesive portion 31. Furthermore, by increasing the heat conductivity of the adhesive material (i.e., the adhesive portion 31) in the above-described way, it will be possible to improve the heat transfer efficiency between the package (21, 25) and the semiconductor acceleration sensor chip 10. As a result, it will be possible to improve the capability of the semiconductor acceleration sensor chip 10 to respond to external temperature changes. That is, according to the first embodiment of the present invention, it is possible to obtain a semiconductor acceleration sensor device 1 which is capable of operating stably with respect to heat transmitted to the package (21, 25).

In addition, the adhesive material according to the present invention is a material that serves to fix the semiconductor acceleration sensor chip 10 to a package comprising a lower container 21 and an upper lid 25, and is comprised of a resin 31a such as silicone resin or fluorine resin, etc., to which flakes 31b are added at 70 to 90 weight %.

As described above, the resin 31a such as silicone resin or fluorine resin, etc. has a comparatively low elastic modulus as compared to a resin such as epoxy resin, etc. By fixing the semiconductor acceleration sensor chip 10 to the package (21, 25) using such resin 31a, the semiconductor acceleration sensor device 1 can have improved impact resistance. By adding flakes 31b comprised of a material such as silver, copper, aluminum, nickel, amorphous carbon, graphite, tin oxide or indium oxide, etc. to the resin 31a at 70 to 90 weight %, for instance, it will be possible to reduce the CTE of an adhesive portion 31, which is a solidified form of the resin 31a, and increase the heat conductivity of the adhesive portion 31 at the same time. Accordingly, by fixing the semiconductor acceleration sensor chip 10 to the package (21, 25) using such adhesive material, it will be possible to reduce the CTE of the semiconductor acceleration sensor chip 10 and the package at the adhesive portion 31. As a result, it will be possible to reduce the amount of deformation in the adhesive portion 31 with respect to temperature changes, and therefore, it will also be possible to have less deformation in the semiconductor acceleration sensor chip 10 caused by deformation of the adhesive portion 31. Moreover, by fixing the semiconductor acceleration sensor chip 10 to the package (21, 25) using such adhesive material, it will be possible to increase the heat conductivity of the semiconductor acceleration sensor chip 10 and the package at the adhesive portion 31. As a result, it will be possible to improve the heat transfer efficiency between the package (21, 25) and the semiconductor acceleration sensor chip 10, and thus, it will be possible to improve the capability of the semiconductor acceleration sensor chip 10 to respond to external temperature changes. That is, according to the first embodiment of the present invention, it is possible to obtain an adhesive material which is capable of realizing a semiconductor acceleration sensor device 1 which can operate stably with respect to heat transmitted to the package (21, 25).

Second Embodiment

Next, a second embodiment of the present invention will be described in detail with reference to the drawings. In the following, the same reference numbers will be used for the structures that are the same as the first embodiment, and redundant explanations of those structural elements will be omitted.

Structure of Semiconductor Acceleration Sensor Device 2

Figure 9A:
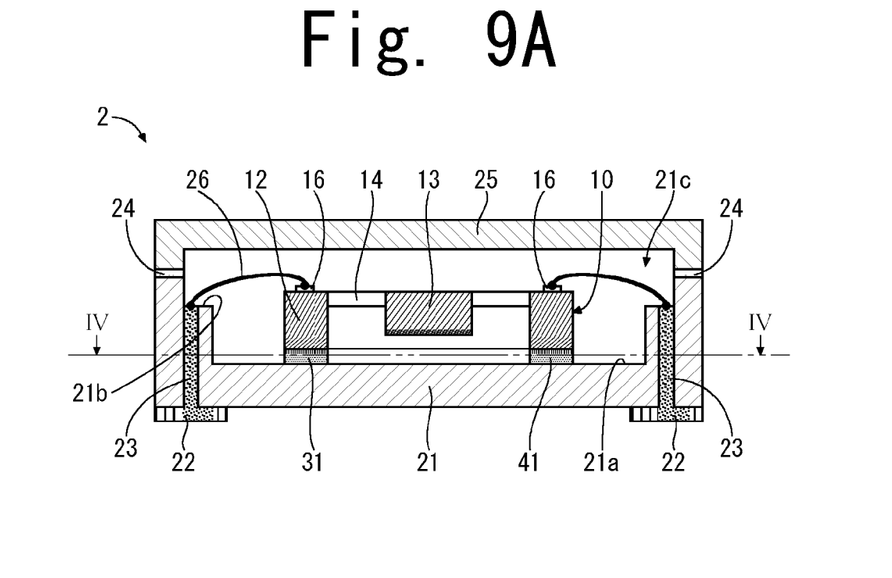
FIG. 9A is a sectional view of a semiconductor acceleration sensor device according to a second embodiment of the present invention.
Figure 9B:
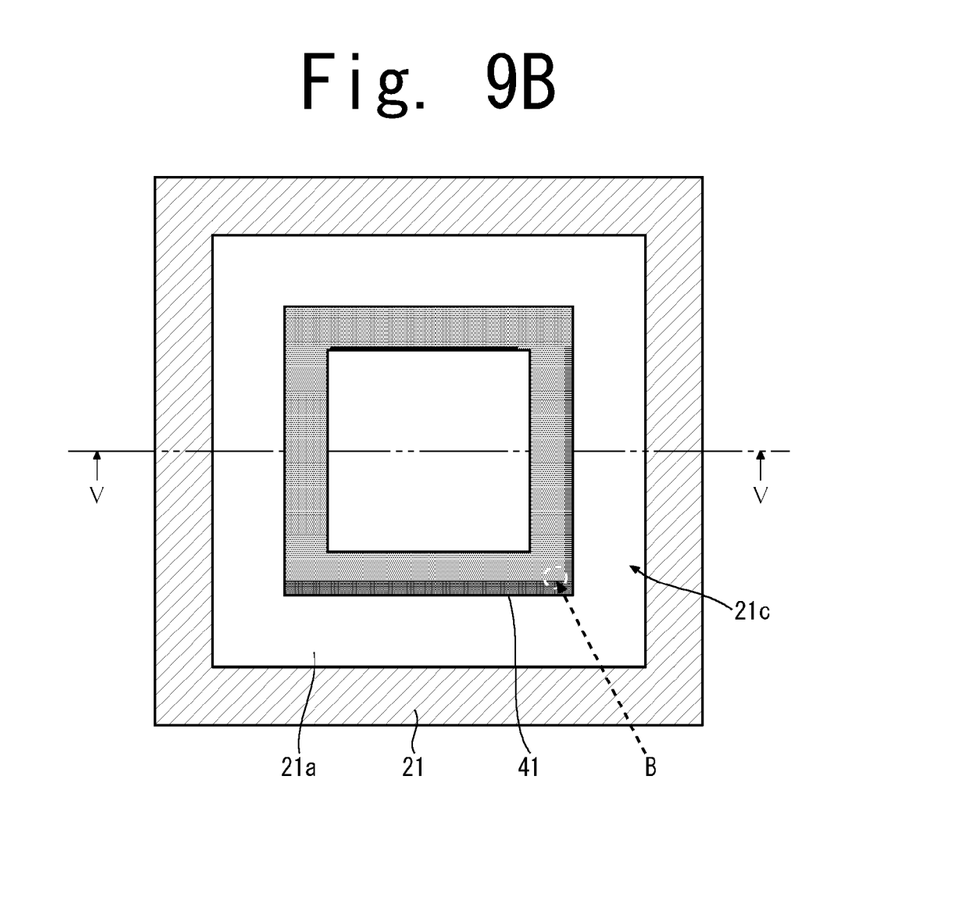
FIG. 9B is a sectional view of the semiconductor acceleration sensor device according to the second embodiment of the present invention taken along line VI-VI' shown in FIG. 9A.

FIG. 9A is a sectional view of the semiconductor acceleration sensor device 2 according to the second embodiment of the present invention. FIG. 9B is a sectional view of the semiconductor acceleration sensor device 2 taken along line VI-VI' shown in FIG. 9A. Here, the section shown in FIG. 9A corresponds to a section of the semiconductor acceleration sensor device 2 taken along line V-V' shown in FIG. 9B.

As shown in FIG. 9A and FIG. 9B, the semiconductor acceleration sensor device 2 has the same structure as the semiconductor acceleration sensor device 1 of the first embodiment, except that the adhesive portion 31 is replaced with an adhesive portion 41.

As in the adhesive portion 31 of the first embodiment, the adhesive portion 41 is a structure that serves to fix the semiconductor acceleration sensor device 2 to the bottom surface 21a of the cavity 21c in the lower container 21, and is a solidified portion of the adhesive material. The rest of the structure is the same as the structure of the semiconductor acceleration sensor device 1 of the first embodiment, and therefore, a detailed description thereof will be omitted.

Figure 10:
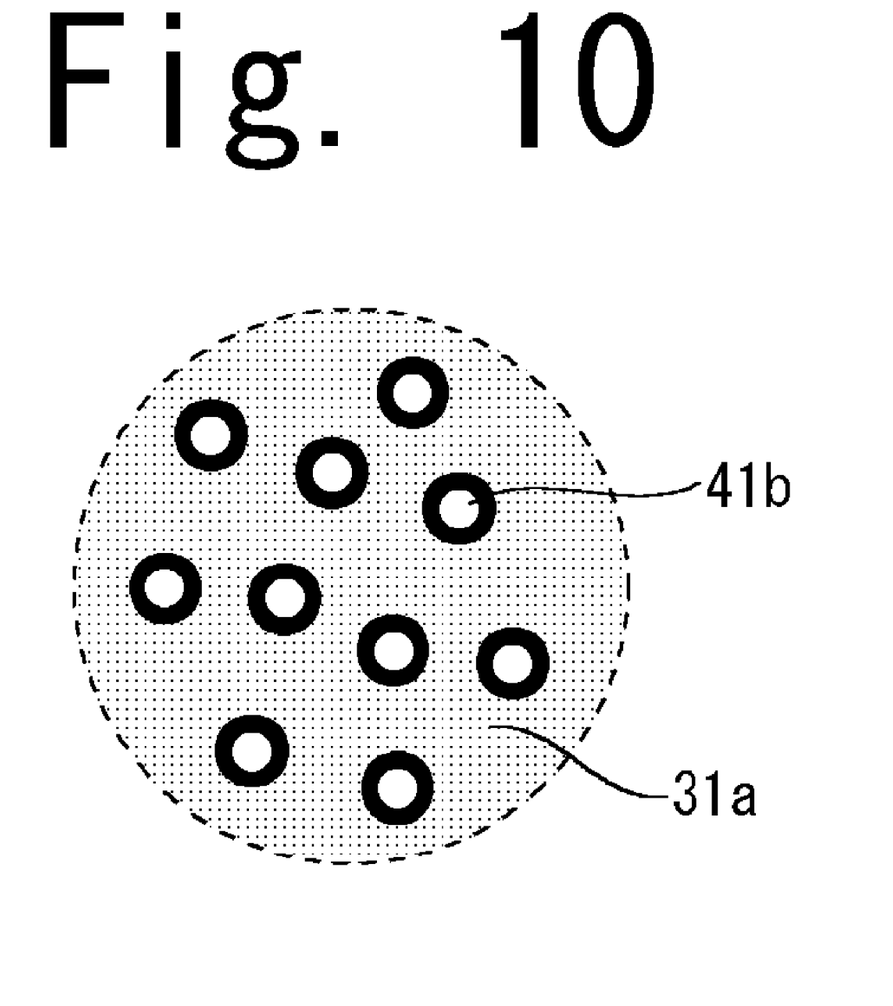
FIG. 10 is a close-up of a region B shown in FIG. 9B.

In this embodiment, an adhesive material for fixing the semiconductor acceleration sensor chip 10 to the bottom surface 21a of the cavity 21c is a resin having a comparatively low elastic modulus and having spherical particles of metal added thereto. FIG. 10 is a close-up of a region B shown in FIG. 9B. Now, the structure of the adhesive portion 41 according to this embodiment will be described with reference to FIG. 10.

As shown in FIG. 10, the adhesive portion 41 in this embodiment is formed by solidifying an adhesive material comprising a resin 31a that is the main component thereof, and spherical metal particles (hereinafter referred to as particles 41b) added to the resin 31a. The resin 31a is the same as that of the first embodiment.

With respect to the particles 41b, it is possible to use metal particles having an average particle diameter of about 5~20 μm. In this embodiment, the resin 31a can include the flakes 31b of the first embodiment, etc.

As with the flakes 31b in the first embodiment, for instance, the material of the spherical particles 41b may be a metal such as silver (Ag), copper (Cu), aluminum (Al), nickel (Ni), etc., or a nonmetal such as amorphous carbon, graphite, tin oxide, indium oxide, etc.

Here, the particles 41b are added to the resin 31a such that their weight percentage in the resin 31a will be about 70 to 90%. Using such resin 31a, it is possible to reduce the CTE of the adhesive portion 41 and increase the heat conductivity of the adhesive portion 41.

Moreover, the viscosity of an adhesive material that contains the particles 41b of this embodiment will not increase as much as it does in the adhesive material containing the metal flakes 31b of the first embodiment. Therefore, in this embodiment, even when metal spheres are added to the resin 31a at larger weight percentage than the first embodiment, it will be possible to prevent the adhesive material from becoming "thready" at the time of application of the adhesive material. Thus, it will be possible to prevent a reduction in the ability of the adhesive material to be applied to the back side of the semiconductor acceleration sensor chip 10. That is, as compared to the first embodiment of the present invention, in the second embodiment, it is possible to further reduce the CTE of the adhesive portion 41 and further increase the heat conductivity of the adhesive portion 41 at the same time, while preventing a reduction in the ability of the adhesive material to coat the back side of the semiconductor acceleration sensor chip 10.

By reducing the CTE of the adhesive material (i.e., the adhesive portion 41) in the manner described above, it will be possible to reduce the amount of change in the adhesive portion 41 with respect to temperature changes, and therefore, it will also be possible to have less deformation in the semiconductor acceleration sensor chip 21 caused by deformation of the adhesive portion 41. Furthermore, by increasing the heat conductivity of the adhesive material (i.e., the adhesive portion 41) in the manner described above, it will be possible to improve the heat transfer efficiency between the package and the semiconductor acceleration sensor chip 10. As a result, it will be possible to improve the capability of the semiconductor acceleration sensor chip 10 to respond to external temperature changes.

A method of manufacturing the semiconductor acceleration sensor device 2 and a method of producing the adhesive material 41A forming the adhesive portion 41 according to this embodiment are the same as that of the first embodiment of the present invention, except that the adhesive material 31A, the adhesive portion 31, and the flakes 31b are replaced with the adhesive material 41A, the adhesive portion 41, and particles 41b, respectively. Thus, redundant explanations of these methods will be omitted.

As described above, the semiconductor acceleration sensor device 2, which is a semiconductor device according to the second embodiment of the present invention, has a cavity 21c in the interior thereof, and includes a package comprising a lower container 21 and an upper lid 25, a semiconductor acceleration sensor chip 10, and an adhesive portion 41 comprising a resin 31a such as silicone resin or fluorine resin, etc. to which spherical metal/nonmetal particles 41b are added, the adhesive portion 41 serving to fix the semiconductor acceleration sensor chip 10 to the interior of the cavity 21c.

As described above, the resin 31a such as silicone resin or fluorine resin, etc. has a comparatively low elastic modulus compared to a resin such as epoxy resin, etc. By fixing the semiconductor acceleration sensor chip 10 to the package (21, 25) using such resin 31a, the semiconductor acceleration sensor device 2 can have improved impact resistance, as with the first embodiment of the present invention. By using the resin 31a to which spherical particles 41b comprised of a material, such as silver, copper, aluminum, nickel, amorphous carbon, graphite, tin oxide or indium oxide, etc. are added at 70 to 90 weight %, for instance, it will be possible to reduce the CTE of the adhesive portion 41, and increase the heat conductivity of the adhesive portion 41 at the same time. By reducing the CTE of the adhesive material (i.e., the adhesive portion 41) this way, it will be possible to reduce the amount of deformation in the adhesive portion 41 against temperature change, and therefore, it will also be possible to have less deformation in the semiconductor acceleration sensor chip 10 due to deformation of the adhesive portion 41. Furthermore, by increasing the heat conductivity of the adhesive material (i.e., the adhesive portion 41) in the manner described above, it will be possible to improve the heat transfer efficiency between the package (21, 25) and the semiconductor acceleration sensor chip 10. As a result, it will be possible to improve the capability of the semiconductor acceleration sensor chip 10 to respond to external temperature changes. That is, according to the second embodiment of the present invention, it is possible to obtain a semiconductor acceleration sensor device 2 which is capable of operating stably with respect to heat transmitted to the package (21, 25).

The adhesive material according to the present invention is a material that is used for fixing a semiconductor acceleration sensor chip 10 to a package comprising a lower container 21 and an upper lid 25, and the adhesive material is comprised of a resin 31a such as silicone resin or fluorine resin, etc., to which spherical particles 41b are added at 70 to 90 weight %.

As described above, the resin 31a such as silicone resin or fluorine resin, etc. has a comparatively low elastic modulus compared to a resin such as epoxy resin, etc. By fixing the semiconductor acceleration sensor chip 10 to the package (21, 25) using such resin 31a, the semiconductor acceleration sensor device 1 can have improved impact resistance. By adding spherical particles 41b comprised of a material such as silver, copper, aluminum, nickel, amorphous carbon, graphite, tin oxide or indium oxide, etc. to the resin 31a at 70 to 90 weight %, for instance, it will be possible to reduce the CTE of an adhesive portion 41, which is a solidified form of the resin 31a, and increase the heat conductivity of the adhesive portion 41 at the same time. Accordingly, by fixing the semiconductor acceleration sensor chip 10 to the package (21, 25) using such adhesive material, it will be possible to reduce the CTE of the semiconductor acceleration sensor chip 10 and the package at the adhesive portion 41. As a result, it will be possible to reduce the amount of deformation in the adhesive portion 41 with respect to temperature changes, and therefore, it will also be possible to have less deformation in the semiconductor acceleration sensor chip 10 caused by deformation of the adhesive portion 41. Moreover, by fixing the semiconductor acceleration sensor chip 10 to the package (21, 25) using such adhesive material, it will be possible to increase the heat conductivity of the semiconductor acceleration sensor chip 10 and the package at the adhesive portion 41. As a result, it will be possible to improve the heat transfer efficiency between the package (21, 25) and the semiconductor acceleration sensor chip 10, and thus, it will be possible to improve the capability of the semiconductor acceleration sensor chip 10 to respond to external temperature changes. That is, according to the second embodiment of the present invention, it will be possible to obtain an adhesive material which is capable of realizing a semiconductor acceleration sensor device 2 that can operate stably with respect to heat transmitted to the package (21, 25).

In addition, according to the second embodiment of the present invention, the particles 41b added to the resin 31a have spherical shapes in order to prevent the adhesive material from having an increased viscosity. Therefore, in this embodiment, even when metal spheres are added to the resin 31a at a larger weight percentage compared to the first embodiment, it will be possible to prevent the adhesive material from becoming "thready" during the application of the adhesive material. Thus, it will be possible to prevent a reduction in the ability of the adhesive material to be applied to the back side of the semiconductor acceleration sensor chip 10. That is, compared to the first embodiment of the present invention, in this embodiment, it is possible to further reduce the CTE of the adhesive portion 41 and further increase the heat conductivity of the adhesive portion 41 at the same time, while preventing a reduction in the ability of the adhesive material be applied to the back side of the semiconductor acceleration sensor chip 10.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-217830. The entire disclosures of Japanese Patent Application No. 2005-217830 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A semiconductor acceleration sensor device, comprising:
    a package having an interior within which is defined a cavity having a bottom;
    a chip having a semiconductor element comprised of an acceleration sensor including a fixing portion, a spindle body, a plurality of beams, and at least one pair of piezoresistive elements provided on at least one of the plurality of beams, the fixing portion being fixed to the bottom of the cavity, the beams suspending the spindle body from the fixing portion, and the spindle body being displaceable with respect to the fixing portion; and
    an adhesive portion that is comprised of (a) one of a silicone resin or a fluorine resin and (b) approximately 70 to 90% by weight of particles each having a predetermined shape and being comprised of one of silver, copper, aluminum, nickel, amorphous carbon, graphite, tin oxide, or indium oxide, that has a reduced coefficient of thermal expansion and an improved heat conductivity due to the particles, and that fixes a back surface of the fixing portion of the chip to the bottom of the cavity of the interior of the package
    wherein each respective pair of the at least one pair piezoresistive elements has an electrical resistance value that varies with external temperature and is characterized by an offset value, and wherein the reduced coefficient of thermal expansion of the adhesive portion stabilizes the offset value with respect to external temperature changes and reduces overshoot so that the acceleration sensor has an improved ability to respond to external temperature changes.

2. The semiconductor acceleration sensor device according to claim 1, wherein the predetermined particles are flake shaped.

3. The semiconductor acceleration sensor device according to claim 1, wherein the particles have an average particle size of about 5±1 μm and an average thickness of about 1±0.1 μm.

4. The semiconductor acceleration sensor device according to claim 1, wherein the particles are spherically shaped.

5. The semiconductor acceleration sensor device according to claim 1, wherein the particles have an average particle size of about 5 to 20 μm.

6. The semiconductor acceleration sensor device according to claim 1, wherein at least a portion of the package is comprised of a ceramic material.

7. The semiconductor acceleration sensor device according to claim 1, wherein the adhesive portion comprises a silicone resin and about 80% by weight of particles having the shape of flakes and being comprised of silver.

8. The semiconductor acceleration sensor device according to claim 1, wherein a plurality of pairs of the at least one pair piezoresistive elements are electrically connected to form a Wheatstone bridge circuit.

* * * * *